United States Patent [19]

Leak et al.

[11] Patent Number: 5,306,963

[45] Date of Patent: Apr. 26, 1994

[54] ADDRESS TRANSITION DETECTION NOISE FILTER IN PULSE SUMMATION CIRCUIT FOR NONVOLATILE SEMICONDUCTOR MEMORY

[75] Inventors: David A. Leak, Rancho Cordova; Sachidanandan Sambandan, Folsom; Kerry Tedrow, Orangevale, all of Calif.

[73] Assignee: Intel Corporation, Santa Clara, Calif.

[21] Appl. No.: 901,276

[22] Filed: Jun. 19, 1992

[51] Int. Cl.$^5$ .................. H03K 17/16; H03K 19/00
[52] U.S. Cl. .................. 307/443; 307/480; 365/233.5
[58] Field of Search .......... 307/443, 480, 236; 328/118; 365/233.5

[56] References Cited

U.S. PATENT DOCUMENTS

| | | | |
|---|---|---|---|
| 4,630,239 | 12/1986 | Reed | 365/233.5 |
| 4,843,596 | 6/1989 | Miyatake | 365/233.5 |
| 5,073,872 | 12/1991 | Masuda | 365/189.05 |
| 5,124,584 | 6/1992 | McClure | 365/233.5 |

*Primary Examiner*—Edward P. Westin
*Assistant Examiner*—Andrew Sanders
*Attorney, Agent, or Firm*—Blakely, Sokoloff, Taylor & Zafman

[57] ABSTRACT

A noise filter to eliminate short, multiple pulses output from an address transition detection ("ATD") circuit caused by address line noise occurring during a read operation of a nonvolatile semiconductor memory. The ATD circuit includes a pulse summation circuit. Each address line sends an input pulse to the pulse summation circuit when the address bit corresponding to the address line changes. The pulse summation circuit adds and extends the input pulses to form output pulses. Pulse extension is performed by a delay chain formed by NAND and NOR gates. Each output pulse begins after a first predetermined time from the leading edge of an input pulse. The delay chain is set on the leading edge of each input pulse. The trailing edge of each input pulse determines when the delay chain will begin to reset. The extended pulse ends after a delay caused by the delay chain unless a subsequent pulse leading edge occurs within a second predetermined time from each trailing edge. In this way, short, multiple input pulses are turned into one long continuous output pulse. This prevents the sending of short pulses into sensing circuits where they would cause the wrong data to be sensed and latched.

18 Claims, 9 Drawing Sheets

ADDRESS TRANSITION DETECTION NOISE FILTER IN PULSE SUMMATION CIRCUIT FOR NONVOLATILE SEMICONDUCTOR MEMORY

FIELD OF THE INVENTION

The present invention relates to the field of nonvolatile semiconductor memory. More specifically, the present invention implements a noise filter for address transition detection circuitry in nonvolatile semiconductor memory.

BACKGROUND OF THE INVENTION

Although it is a relatively new semiconductor technology, flash memory is well known and widely used in the art. Flash memory is nonvolatile, meaning that it retains its content even if power is removed. This is in contrast to volatile memory technologies like static random access memory ("SRAM") and dynamic random access memory ("DRAM") that require continuous power to store information. Flash memory's cell structure and erasable programmable read-only memory ("EPROM") foundation also insure that it is extremely cost-effective to manufacture, continually scalable to higher densities, and highly reliable. This is a combination of characteristics that other semiconductor memory technologies currently lack.

In contrast to EPROM's, however, which can only be erased through exposure to ultra violet light, the flash memory array is electrically erasable in bulk. This distinguishes it from traditional electrically erasable programmable read-only memory ("EEPROM") that are by definition byte-alterable. The flash memory erase function empties part of the device all at once. The device can be programmed (written to) incrementally, however, which is an important capability for applications that require data/file updates.

Flash memory can be read very quickly. However, it takes a significantly longer amount of time to write information into flash memory or to erase the flash memory than it does to read the memory. Part of the reason for this is that, while a location is simply read from flash memory, writing and erasing is an iterative process. Each erase or write operation must be repeated several times and verified to insure that the erasure or write operation has completed successfully. Normally, when neither the write nor erase operations are enabled, the flash memory unit is by default in a read state.

Address transition detection ("ATD") is also well known in the art and has been widely used in SRAM and EPROMs. The purpose of address transition detection circuitry is to increase the speed with which data can be read from memory. This is accomplished by performing operations which are required for every memory read operation as soon as an address transition has been detected.

These operations include equalizing sense amplifiers and latching the previous output. The sense amplifiers are used to increase weak signals sensed from the memory cells to be read during the read operation. Equalizing the sense amplifiers causes the amplifiers to be cleared or otherwise set up so that they are ready to process the new data to be read. Latching the previous output of the output to stay static until the new data from the read operation has been output from the sense amplifiers. The previous output is latched because the output of the sense amplifiers fluctuates before it finally reaches a steady value. Latching the previous output ensures that the swing does not pass down to the outputs.

Circuitry to equalize the sense amplifiers and latch pervious output is well known in the art. In fact, both operations are normally performed during a memory read operation. The address detection circuitry of the present invention simply permits these operations to be performed earlier than would be the case where address transition detection is not employed. However, noise on address lines can cause an ATD scheme to fail by beginning a read operation on an improper address.

SUMMARY AND OBJECTS OF THE INVENTION

One object of the present invention is to provide address transition detection to nonvolatile semiconductor memory in a environment where there is noise on the address signal lines.

Another object of the present invention is to guarantee generation of a minimum address transition detected pulse.

The purpose of the circuit of the present invention is to filter out noise on address lines and thereby ensure that the nonvolatile semiconductor ("flash") memory device reads correct data.

These and other objects of the present invention are achieved by a noise filter circuit for a digital input signal. The digital input signal comprises at least one input signal pulse. Each input signal pulse has a leading and a trailing edge. The input signal pulse transitions from a first voltage level to a second voltage level on the leading edge and then transitions from the second voltage level to the first voltage level on the trailing edge. The first voltage level is not equal to the second voltage level.

The noise filter circuitry is comprised of an inversion circuit and a delay chain circuit.

The inversion circuit inverts and delays the digital input signal by a first delay period. The inversion circuit has as input the digital input signal and has as output an intermediate signal. The intermediate signal is an inversion of the digital input signal and lags the digital input signal by the first delay period. The intermediate signal transitions from the second voltage level to the first voltage level the first delay period following each leading edge of the digital input signal. The intermediate signal transitions from the first voltage level to the second voltage level the first delay period following each trailing edge of the digital input signal.

The delay chain circuit is coupled to the inversion circuit. The delay chain circuit has as input the digital input signal and the intermediate signal. The delay chain circuit has as output a filtered output signal. If the filtered output signal is not at the second voltage level, the filtered output signal transitions to the second voltage level a second delay period following the leading edge. The delay chain circuit introduces a third delay period, the third delay period is longer than the second delay period. The third delay period resets following the trailing edge of each digital input signal pulse. Therefore, the filtered output signal transitions to the first voltage level the third delay period following the trailing edge unless a subsequent leading edge occurs within the third delay period minus the second delay period from the trailing edge.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

An apparatus and method is disclosed for implementing noise filtering for address transition detection circuitry in nonvolatile ("flash") memory.

Figure 1:
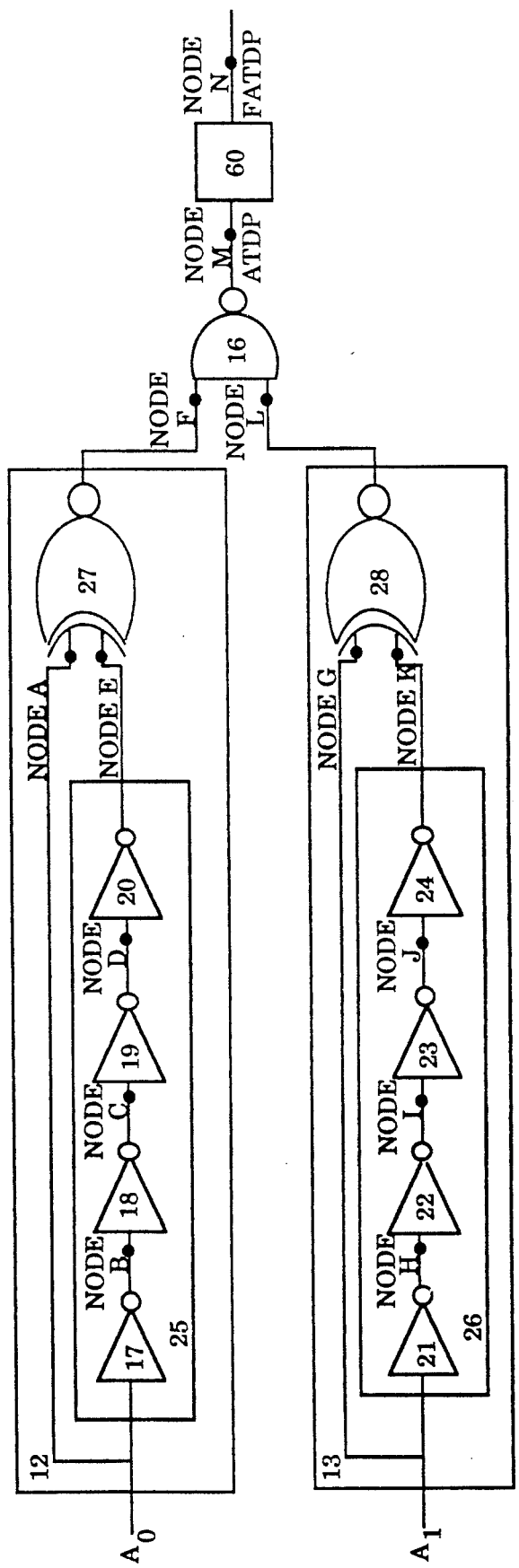
FIG. 1 illustrates two bit address transition detection circuitry with noise filtering.

FIG. 1 depicts an address transition detection ("ATD") circuit 10 for a flash memory device. In this simple ATD circuit, address signals A0 and A1 are input into transition pulse generation circuitry 12 and 13 respectively. Together, address signals A0 and A1 form a two-bit address, with A0 being the least significant bit of the address and A1 being the most significant bit of the address. A two bit address scheme has been presented in FIG. 1 to simplify the circuit for ease of presentation. In the preferred embodiment, the address is comprised of at least eighteen bits, each of which is input into a separate transition pulse generation circuit 12, in a manner which is easily extendible by one skilled in the art.

The output signals of transition pulse generation circuitry 12 and 13 are each input into NAND gate 16 at NODES F and L, respectively. The output of NAND gate 16 (which in prior art would also be the output of ATD circuit 10) appears at NODE M and is signal address transition detection pulse ("ATDP"). In the prior art, a pulse on signal ATDP causes the sense amplifiers (not shown) to be equalized and previous output to be latched. However, as will be discussed below in connection with FIGS. 2A-4B, in an embodiment of the present invention, signal ATDP is input into noise filter circuit 60. The output of noise filter 60 is signal filtered ATDP ("FATDP") and appears at NODE N. In the ATD circuit 10, signal FATDP causes the sense amplifiers (not shown) to be equalized and previous output to be latched.

Transition pulse generation circuit 12 is comprised of delay chain 25 and exclusive-NOR (XNOR) gate 27. Address signal A0 provides a first input to XNOR gate 27 at NODE A. Delay chain 25 provides a second input to XNOR gate 27 at NODE E. Inverters 17-20 are coupled in series at NODE B-D, respectively, and together form delay chain 25.

Input signal A0 is applied to inverter 17 which is the first inverter in delay chain 25. The output of inverter 17 is input to inverter 18. Similarly, the output of inverter 18 is input to inverter 19. Finally, the output of inverter 19 is input to inverter 20.

Inverters 17-20 are a type of circuit well known in the art. The signal output from an inverter is the opposite of the signal input to the inverter delayed by a delay period. Hence, if a high (logical one) signal is input to an inverter, a low (logical zero) signal will be output from the inverter after the delay period. On the other hand, if a low (logical zero) signal is input to the inverter, a high (logical one) signal will be output from the inverter after the delay period.

Each inverter 17-20 delays the signal input to it one delay period. Because there are an even number of inverters in delay chain 25, the output of the delay chain 25 at NODE E will be the same as address signal A0, delayed by the product of the number of inverters in the chain (four) and the delay time period. Hence, a signal transition from high to low input to inverter 17 will cause a corresponding transition from high to low to be output from inverter 20 four inverter delay periods later. Similarly, a signal transition from low to high input to inverter 17 will cause a corresponding transition from low to high to be output from inverter 20 four inverter delay periods later. The length of delay in a delay chain can be lengthened by adding one or more pairs of inverters in series with the inverters in the delay chain. Generally, the delay chain length would be specified by the design engineer to provide at least the minimum length signal ATDP pulse necessary to correctly read data (e.g. permit the sense amplifiers to be equalized and previous output to be latched).

XNOR gate 27 is a type of logic circuit well known in the art. XNOR gate 27 will have as output a high signal (logical one) whenever the inputs to XNOR gate 24 are the same (i.e. signal at NODE A and signal at NODE E both high or both low). The output of XNOR gate 27 will be low (logical zero) whenever the inputs to XNOR gate 27 are not the same (i.e. signal at NODE A high when signal at NODE E is low, or signal at NODE A low when signal at NODE E is high).

Whenever there is a transition in signal A0, delay chain 25 will cause the signal at NODE E to maintain the old value of signal A0 for four delay periods before transitioning to the new value of signal A0. During those four delay periods, the signal at NODE A will not equal the signal at NODE E. Therefore, XNOR gate 27 will output to NODE F a low (logical zero) pulse four delay periods long whenever there is a transition in signal A0.

NAND gate 16 is a type of circuitry well known in the art. The output of a NAND gate is high (logical one) so long as both inputs to the NAND gate are not high. If both inputs to the NAND gate are high (logical one), then the output of the NAND gate will be low (logical zero).

Transition pulse generation circuit 13 is comprised of delay chain 26 and exclusive-NOR (XNOR) gate 28. Address signal A1 provides a first input to XNOR gate 28 at NODE G. Delay chain 26 provides a second input to XNOR gate 28 at NODE K. Inverters 21-24 are coupled in series at NODES H-J and together form delay chain 26.

An address to be read from the flash memory is input over address signal lines A0 and A1. Whenever a new address is requested by the user, at least one of address signals A0 or A1 must change value from zero to one, or from one to zero. This is because the only way that the address can change is if one of the bits of the address changes. Any transition in address signal A0 or A1 will cause a pulse signal ATDP to be generated by ATD circuit 10. This concept is best demonstrated by example.

Figure 2A:
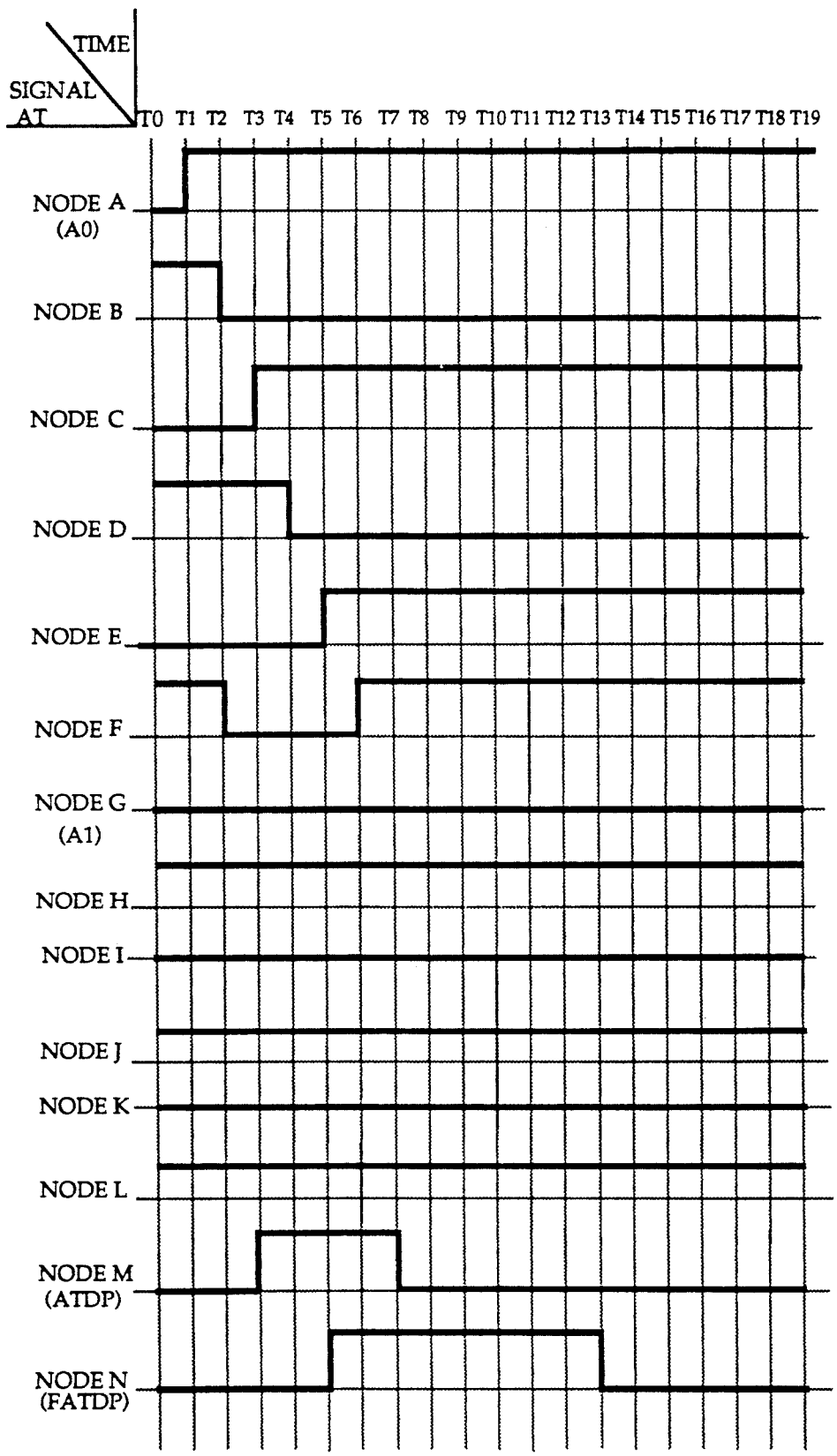
FIG. 2A illustrates address transition detection signal timing for an address transition.

FIG. 2A depicts a timing diagram for the signals at NODES A-N of FIG. 1 during an address transition. In FIG. 2A, each time period T0-19 is equal to one gate delay period. The signal at NODE A corresponds to address signal A0. Similarly, the signal at NODE G corresponds to address signal A1. In the example of FIG. 2A, address signal A1 will not change during the example. Address signal A0, however, will transition from zero to one at time T1. This corresponds to a transition on the address signal lines at time T1 from binary address 00 (A1=0, A0=0) to binary address 01 (A1=0, A0=1).

The signal at NODE B is the signal at NODE A (address signal A0) inverted and lags the signal at NODE A by one gate delay period. The signal at NODE C is the signal at NODE B inverted and lags the signal at NODE B by one gate delay period. From this it follows that the signal at NODE C is the same as the signal at NODE A except that the signal at NODE C lags the signal at NODE A by two gate delay periods.

Furthermore, the signal at NODE D is the signal at NODE C inverted and lags the signal at NODE C by one gate delay period. The signal at NODE E is the signal at NODE D inverted and lags the signal at NODE D by one gate delay period. From this it follows that the signal at NODE E is the same as the signal at NODE A except that the signal at NODE E lags the signal at NODE A by four gate delay periods.

Similarly, the signal at NODE H is the signal at NODE G (address signal A1) inverted and lags the signal at NODE G by one gate delay period. The signal at NODE I is the signal at NODE H inverted and lags the signal at NODE H by one gate delay period. From this it follows that the signal at NODE I is the same as the signal at NODE G except that the signal at NODE I lags the signal at NODE G by two gate delay periods.

Furthermore, the signal at NODE J is the signal at NODE I inverted and lags the signal at NODE I by one gate delay period. The signal at NODE K is the signal at NODE J inverted and lags the signal at NODE J by one gate delay period. From this it follows that the signal at NODE K is the same as the signal at NODE G except that the signal at NODE I lags the signal at NODE G by four gate delay periods.

In this example, the signal at NODE G (address signal A1) remains zero. Therefore, the signal at NODES H and J remain one and the signal at NODES I and K remain zero.

The signal at NODE L lags the signals at NODES G and K by one gate delay period and is formed by performing a logical XNOR operation on the signals at NODES G and K. Since the signals at NODES G and K both remain zero throughout the example. The signal at NODE L will remain one.

On the other hand, the signal at NODE A transitions from zero to one at T1. This causes the signal at NODE B to transition from one to zero at T2. In turn, the signal at NODE C transitions from zero to one at T3, the signal at NODE D transitions from one to zero at T4, and the signal at NODE E transitions from zero to one at T5.

The signal at NODE F lags the signals at NODES A and E by one gate delay period and is formed by performing a logical XNOR operation on the signals at NODES A and E. The signals at NODE A and E are equal at all times except from T1 to T5. Therefore, the signal at NODE D will be one except from T2 to T6 when it will have the value of zero.

The signal at NODE M is signal ATDP. The signal at NODE M lags the signals at NODES F and L by one gate delay period and is formed by performing a logical NAND operation on the signals at NODES F and L. As previously stated, the signal at NODE L will have the value one throughout the example. Therefore, the signal at NODE M will have a value of zero at all times except T3 to T7. During the interval from T3 to T7, the signal at NODE M will be a positive pulse that lasts for four delay periods.

The signal at NODE M is noise filtered to become the signal at NODE N. The signal at NODE N is a single pulse which has a leading edge two gate delay periods after the leading edge of the signal at NODE M pulse. The signal at NODE N has a trailing edge six gate delay periods after the trailing edge of the signal at NODE M pulse. Transformation of the signal at NODE M to the signal at NODE N as occurs in this example will be discussed below in connection with FIGS. 3 and 4A.

Hence, in summary, in the example of FIG. 2A, a transition on address signal line A0 at time T1 causes a four delay period length signal ATDP positive pulse to be output at NODE M from T3 to T7. In prior art, this positive pulse would cause the sense amplifiers (not shown) to be equalized and previous output to be latched to prepare for reading the memory location corresponding to the new address indicated by the transition on address signal line A0.

Figure 2B:
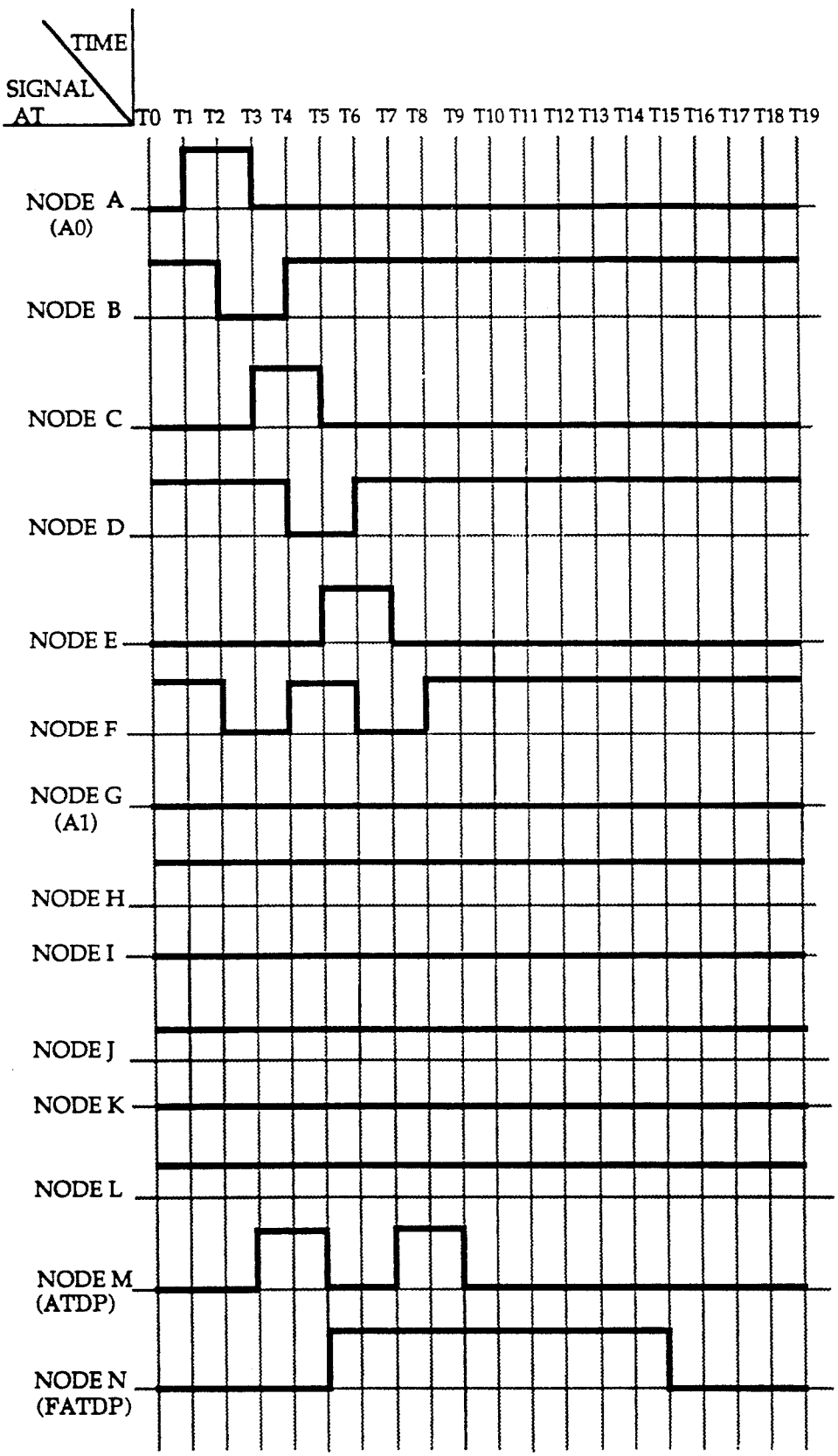
FIG. 2B illustrates address transition detection signal timing for an address transition caused by noise.

FIG. 2B depicts a timing diagram for the signals at nodes A-N of FIG. 1 during an address transition which is caused by a short length noise pulse. A noise pulse on an address line is a rapid high-low-high or low-high-low transition. If the noise pulse has a shorter length than the length of the delay period caused by delay chain 25, then a series of short pulses will be generated in signal ATDP. The noise pulse could be caused by any of several sources (e.g. circuit board inductance).

In the example of FIG. 2B, a low-high-low noise pulse with a length of two delay periods is generated on signal line A0 from T1 to T3. Hence, address signal A0 will transition from zero to one at time T1 and then back to zero at T3. Thus, the noise pulse corresponds to a false address transition at T1 from binary address 00 (A1=0, A0=0) to 01 (A1=0, A0=1), and back to 00 again at T3.

In this example, the signal at NODE G (address signal A1) remains zero throughout the example. Therefore, the signals at NODES G-L will have the same values as they had in the example of FIG. 2A.

On the other hand, in the example of FIG. 2B, the signal at NODE A (address signal A0) transitions from zero to one at T1 and back to zero at T3. This causes the signal at NODE B to transition from one to zero at T2 and back to one at T4. In turn, the signal at NODE C transitions from zero to one at T3 and back to zero at T5. This causes the signal at NODE D to transition from one to zero at T4 and back to one at T6. In turn, the signal at NODE E transitions from zero to one at T5 and back to zero at T7.

The signals at NODE A and E are equal at all times except from T1 to T3 and from T5 to T7. Therefore, the signal at NODE F will be one except from T2 to T4 and from T6 to T8 when it will have the value of zero.

As previously stated, the signal at NODE L will be one throughout the example. Therefore, the signal at NODE M (signal ATDP) will have a value of zero at all times except T3 to T5 and T7 to T9. During the intervals from T3 to T5, the signal at NODE M will be a first positive pulse that lasts for two delay periods. During the interval from T6 to T8, the signal at NODE M will be a second positive pulse that lasts for two delay periods.

The signal at NODE M is noise filtered to become the signal at NODE N. The signal at NODE N is a single pulse which has a leading edge two gate delay periods after the leading edge of the first signal at NODE M pulse. The signal at NODE N has a trailing edge six gate delay periods after the trailing edge of the second signal at NODE M pulse. Transformation of the signal at NODE M to the signal at NODE N as occurs in this example will be discussed below in connection with FIGS. 3 and 4B.

Hence, in summary, in the example of FIG. 2B, a two delay period noise pulse on address signal line A0 which started at time T1 caused a first two delay period positive pulse to be output at NODE M from T3 to T5. Then, it caused a second two delay period positive pulse to be output at NODE M from T7 to T9.

In the prior art, the two short pulses of the signal at NODE M would cause the wrong data to be sensed and might cause the memory device to read the wrong data.

Figure 3:
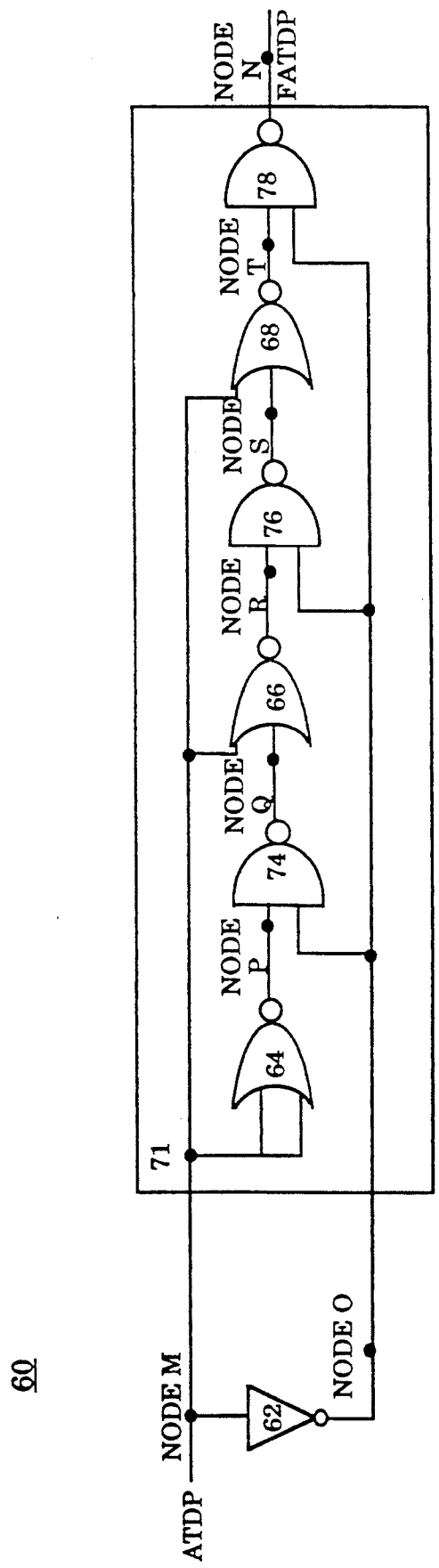
FIG. 3 illustrates six gate delay noise filter circuitry for positive pulses.

FIG. 3 depicts the six gate delay period noise filter circuit 60. Noise filter circuit 60 is comprised of an inverter 62 and a reset delay circuit 71. The reset delay circuit 71 is comprised of NOR gates 64-68 and NAND gates 74-78.

NOR gates 64-68 are also a type of circuitry well known in the art. A NOR gate has two inputs and a single output. The output of a NOR gate is low (logical zero) so long as both inputs to the NOR gate are not low. If both inputs to the NOR gate are low (logical zero), then the output of the NOR gate will be high (logical one).

Signal ATDP is coupled to inverter 62, to a first input of NOR gates 64-68 and to a second input of NOR gate 64 at NODE M. Therefore, Signal ATDP is input into inverter 62, the second input of NOR gate 64 and is also input into the first input of NOR gates 64-68. It will be obvious to one skilled in the art that because both inputs of NOR gate 64 are coupled at NODE M, NOR gate 64 could be replaced with an inverter.

Inverter 62 is coupled at NODE O to a first input of NAND gates 74-78. The output of inverter 62 is input into the first input of NAND gates 74-78. The outputs of NOR gates 64-68 are input into a second input of NAND gates 74-78, at NODES P, R, and T, respectively. The outputs of NAND gates 74-76 are input into a second input of NOR gates 66-68, at NODES Q and S, respectively. Together, NOR gates 64-68 and NAND gates 74-78 form a six gate delay chain. Signal filtered ATDP ("FATDP") is output from NAND gate 78 at NODE N.

The six gate delay chain extends the signal FATDP pulse six gate delay periods beyond the trailing edge of a signal ATDP pulse.

Inputting a first single impulse signal ATDP to noise filter circuit 60 causes a second single impulse signal to be generated at NODE N (signal FATDP) delayed by the second delay period. The second delay period delay between signals ATDP and FATDP is caused by inverter 62 and NAND gate 78 which together introduce a two gate delay shift between the leading edge of a signal ATDP pulse input to noise filter circuit 60 and the leading edge of a signal FATDP pulse. The second impulse signal will have the length of the first impulse signal plus an additional minimum duration pulse signal length. The additional minimum duration pulse length is formed by reset delay circuit 71 and is equal to the third delay period (six gate delay periods in this circuit). The additional minimum pulse length can be extended by adding additional logic gates to reset delay circuit 71 in a manner that will be obvious to one skilled in the art.

Noise filter circuit 60 is always reset on the leading edge of a signal ATDP pulse. The trailing edge of a signal ATDP pulse causes the reset delay circuit 71 of noise filter circuit 60 to begin clocking out. Therefore, multiple signal ATDP pulses input to noise filter circuit 60 are combined into one pulse signal at NODE N. The combination only occurs however if no more than the third delay period minus the second delay period elapses between the leading edge of a subsequent pulse and the trailing edge of its immediate successor pulse.

The behavior of noise filter circuitry 60 is best described by example.

Figure 4A:
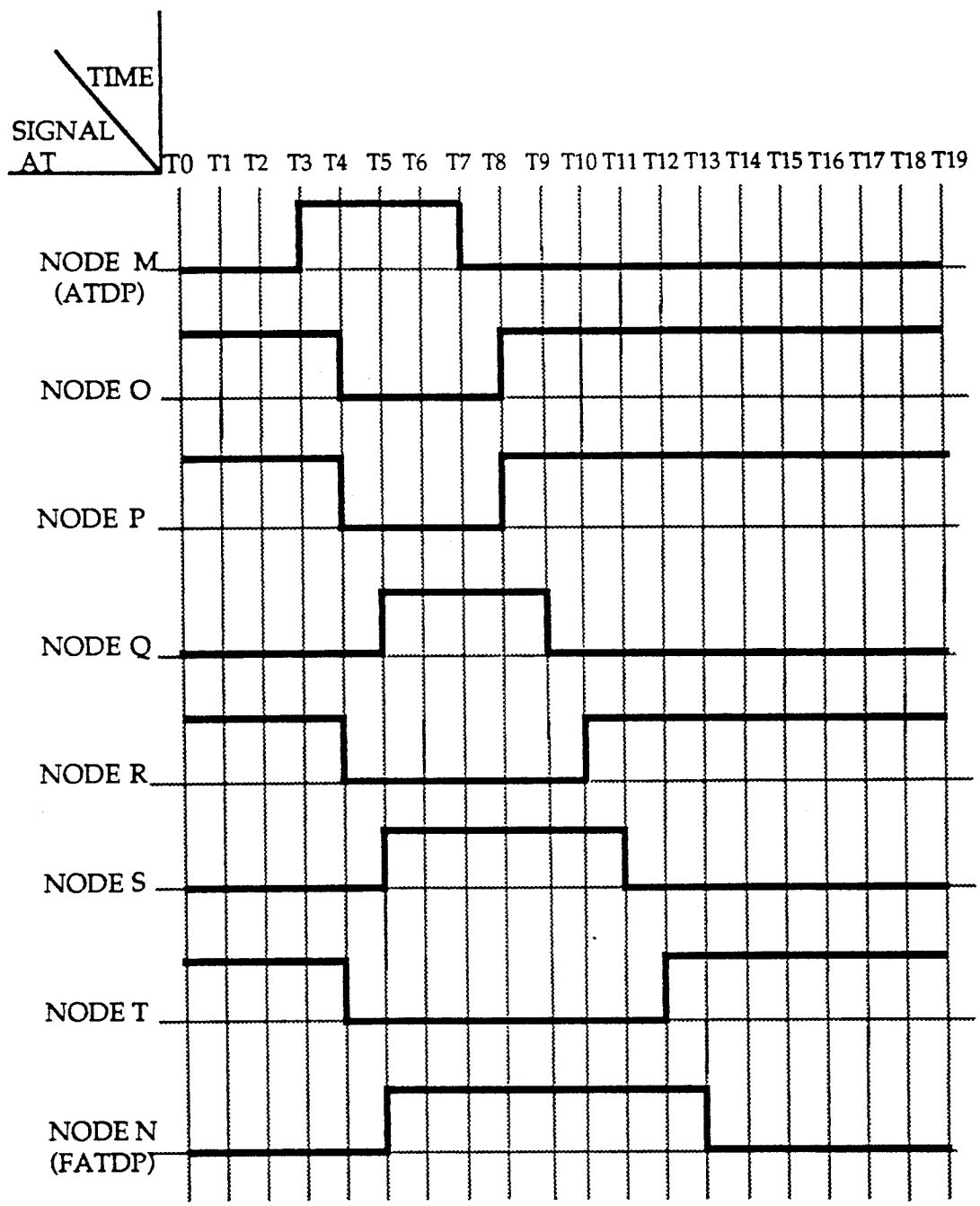
FIG. 4A illustrates address transition detection noise filter signal timing for the address transition of FIG. 2A.

FIG. 4A depicts a timing diagram for the signals at nodes M–T of FIG. 3 when the signal at NODE M of the example of FIG. 2A is input as signal ATDP. In FIG. 4A, each time period T0-19 is equal to one gate delay period. The signal at NODE N corresponds to signal FATDP.

The signal at NODE O is the signal at NODE M inverted and lags the signal at NODE M by the first delay period. In this example, the first delay period is one gate delay period. The signal at NODE P is also the signal at NODE M inverted and lags the signal at NODE M by one gate delay period. The signal at NODE M transitions from zero to one at T3 and then transitions back to zero at T7. Therefore, the signals at NODES O and P will both transition from one to zero at T4 and then transition back from zero to one at T8.

The signal at NODE Q lags the signals at NODES O and P by one gate delay and is formed by performing a logical NAND operation on the signals at NODES O and P. Therefore, the signal at NODE Q has a value of zero until T5 when it transitions to one because the signals at NODES O and P both transitioned from one to zero at T4. Then, the signal at NODE Q has a value of one until T9 when it transitions to zero because the signals at NODES O and P both transitioned from zero to one at T8. Note that the T5 transition in the signal at NODE Q corresponds to the leading edge of the pulse in signal ATDP at T3 (delayed by two gate delays).

The signal at NODE R lags the signals at NODES M and Q by one gate delay and is formed by performing a logical NOR operation on the signals at NODES M and Q. Therefore, the signal at NODE R has a value of one until T4 when it transitions to zero because the signal at NODE M transitioned from zero to one at T3. The signal at NODE Q transitions from zero to one at T5 and then the signal at NODE M transitions back from one to zero at T7. Finally, the signal at NODE Q transitions back from one to zero at T9. Therefore, the signal at NODE R transitions from one to zero at T4 and then transitions back to one at T10. Note that the T4 transition in the signal at NODE R corresponds to the leading edge of the pulse in signal ATDP at T3 (delayed by one gate delay).

The signal at NODE S lags the signals at NODES O and R by one gate delay and is formed by performing a logical NAND operation on the signals at NODES O and R. Therefore, the signal at NODE S has a value of zero until T5 when it transitions to one because the signals at NODES O and R both transitioned from one to zero at T4. Then, the signal at NODE S has a value of one until T11 when it transitions to zero because the signals at NODES O and R transitioned from zero to one at T8 and T10, respectively. Note that the T5 transition in the signal at NODE S corresponds to the leading edge of the pulse in signal ATDP at T3 (delayed by two gate delays).

The signal at NODE T lags the signals at NODES M and S by one gate delay and is formed by performing a logical NOR operation on the signals at NODES M and S. Therefore, the signal at NODE T has a value of one until T4 when it transitions to zero because the signal at NODE M transitioned from zero to one at T3. The signal at NODE S transitions from zero to one at T5 and then the signal at NODE M transitions back from one to zero at T7. Finally, the signal at NODE S transitions back from one to zero at T11. Therefore, the signal at NODE T transitions from one to zero at T4 and then transitions back to one at T12. Note that the T4 transition in the signal at NODE T corresponds to the leading edge of the pulse in signal ATDP at T3 (delayed by one gate delay).

The signal at NODE N is signal FATDP and remains one from T5 to T13 when it transitions back to zero. The signal at NODE N lags the signals at NODES O and T by one gate delay and is formed by performing a logical NAND operation on the signals at NODES O and T. Therefore, the signal at NODE N has a value of zero until T5 when it transitions to one because the signals at NODES O and T both transitioned from one to zero at T4. Then, the signal at NODE N has a value of one until T13 when it transitions to zero because the signals at NODES O and T transitioned from zero to one at T8 and T12, respectively. Note that the T5 transition in the signal at NODE Q corresponds to the leading edge of the pulse in signal ATDP at T3 (delayed by two gate delays). Also note that the signal at NODE N is simply an inversion of the signal at NODE T (delayed by one gate delay). The trailing edge transition of the signal ATDP at T7 corresponds to the beginning of the six gate delay third delay period delay in the signal FATDP.

Hence, in summary, the leading edge of the first pulse in signal ATDP causes a pulse to be output from noise filter circuit 60 after a second delay period delay. The trailing edge of the first pulse would normally cause the pulse output from noise filter circuit 60 to end after the third delay period. However, if the leading edge of a subsequent pulse in signal ATDP occurs within the third delay period minus the second delay period after the trailing edge of a preceding signal ATDP pulse, the pulse output from noise filter 60 is reset and does not terminate until a third delay period delay after the trailing edge of the subsequent pulse in signal ATDP. In this way, a series of short pulses in signal ATDP is converted into one continuous pulse output from noise filter circuit 60. Furthermore, the continuous pulse output from noise filter circuit 60 will have a minimum duration equal to the third delay period. The minimum duration can be varied by adding logic gates to the delay chain in noise filter 60. Therefore, the sense amplifiers (not shown) will not be equalized and previous output will not be latched until a specifiable time period has elapsed after the last address transition pulse.

Figure 4B:
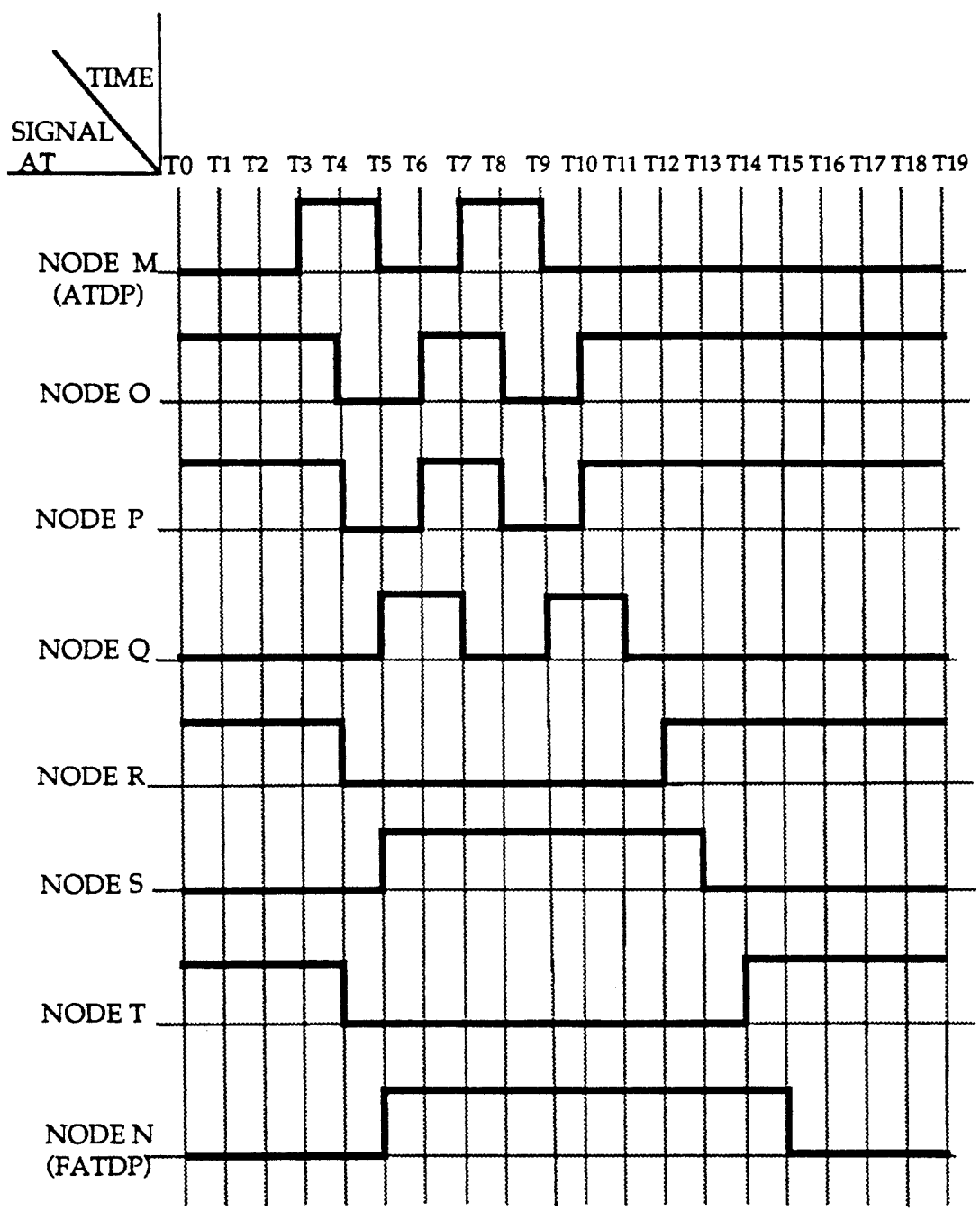
FIG. 4B illustrates address transition detection noise filter signal timing for the address transition caused by noise of FIG. 2B.

FIG. 4B depicts a timing diagram for the signals at nodes M-T of FIG. 3 when the signal at NODE M of the example of FIG. 2B is input as signal ATDP. Noise filter circuit 60 combines the two short pulses of signal ATDP into a single long pulse in signal FATDP. In FIG. 4B, each time period T0-19 is equal to one gate delay period. The signal at NODE N corresponds to signal FATDP.

The signal at NODE O is the signal at NODE M inverted and lags the signal at NODE M by the first delay period. In this example, the first delay period is one gate delay period. The signal at NODE P is also the signal at NODE M inverted and lags the signal at NODE M by one gate delay period. The signal at NODE M transitions from zero to one in a first pulse at T3 and then transitions back to zero at T5. Then, in a second pulse, the signal at NODE M transitions from zero to one at T7 and then transitions back to zero at T9. Therefore, the signals at NODES O and P will both transition from one to zero at T4, transition back from zero to one at T6, transition from one to zero at T8 and then transition back from zero to one at T10.

The signal at NODE Q lags the signals at NODES O and P by one gate delay and is formed by performing a logical NAND operation on the signals at NODES O and P. Therefore, the signal at NODE Q has a value of zero until T5 when it transitions to one because the signals at NODES O and P both transitioned from one to zero at T4. Then, the signal at NODE Q has a value of one until T7 when it transitions to zero because the signals at NODES O and P both transitioned from zero to one at T6. Next, the signal at NODE Q has a value of zero until T9 when it transitions to one because the signals at NODES O and P both transitioned from one to zero at T8. Finally, the signal at NODE Q has a value of one until T11 when it transitions to zero because the signals at NODES O and P both transitioned from zero to one at T10. Note that the T5 and T9 transitions in the signal at NODE Q correspond to the leading edge of the first and second pulses in signal ATDP at T3 and T7, respectively, delayed by two gate delays. Also, not that the T7 and T11 transitions in the signal at NODE Q correspond to the trailing edge of the first and second pulses in signal ATDP at T5 and T9, respectively, also delayed by two gate delays.

The signal at NODE R lags the signals at NODES M and Q by one gate delay and is formed by performing a logical NOR operation on the signals at NODES M and Q. Therefore, the signal at NODE R has a value of one until T4 when it transitions to zero because the signal at NODE M transitioned from zero to one at T3. The signals at NODES M and Q do not both have a value of zero again until T11 when the signal at NODE Q transitions back from one to zero. Therefore, the signal at NODE R transitions from one to zero at T4 and then transitions back to one at T12. Note that the T4 transitions in the signal at NODE R corresponds to the leading edge of the pulse in signal ATDP at T3 (delayed by one gate delay).

The signal at NODE S lags the signals at NODES O and R by one gate delay and is formed by performing a logical NAND operation on the signals at NODES O and R. Therefore, the signal at NODE S has a value of zero until T5 when it transitions to one because the signals at NODES O and R both transitioned from one to zero at T4. Then, the signal at NODE S has a value of one until T13 when it transitions to zero because the signals at NODES O and R transitioned from zero to one at T10 and T12, respectively. Note that the T5 transition in the signal at NODE S corresponds to the leading edge of the first pulse in signal ATDP at T3 (delayed by two gate delays). Also note that the T13 transition in the signal at NODE S corresponds to the trailing edge of the second pulse in signal ATDP at T9 (delayed by four gate delays).

The signal at NODE T lags the signals at NODES M and S by one gate delay and is formed by performing a logical NOR operation on the signals at NODES M and S. Therefore, the signal at NODE T has a value of one until T4 when it transitions to zero because the signal at NODE M transitioned from zero to one at T3. The signals at NODES M and S do not both have a value of zero again until T13 when the signal at NODE S transitions back from one to zero. Therefore, the signal at NODE T transitions from one to zero at T4 and then transitions back to one at T14. Note that the T4 transition in the signal at NODE T corresponds to the leading edge of the pulse in signal ATDP at T3 (delayed by one gate delay).

The signal at NODE N is signal FATDP and remains one from T5 to T15 when it transitions back to zero. The signal at NODE N lags the signals at NODES O and T by one gate delay and is formed by performing a logical NAND operation on the signals at NODES O and T. Therefore, the signal at NODE N has a value of zero until T5 when it transitions to one because the signals at NODES O and T both transitioned from one to zero at T4. Then, the signal at NODE N has a value of one until T15 when it transitions to zero because the signals at NODES O and T transitioned from zero to one at T10 and T14, respectively. Note that the T5 transition in the signal at NODE Q corresponds to the leading edge of the pulse in signal ATDP at T3 (delayed by two gate delays). Also note that the signal at NODE N is simply an inversion of the signal at NODE T (delayed by one gate delay). Furthermore, the trailing edge transition of the signal ATDP at T9 corresponds to the beginning of the six gate delay third delay period delay in the signal FATDP.

Hence, in summary, the leading edge of the first pulse in signal ATDP causes a pulse to be output from noise filter circuit 60 after a second delay period delay. The trailing edge of the first pulse would normally cause the pulse output from noise filter circuit 60 to end after the third delay period. However, if the leading edge of a subsequent pulse in signal ATDP occurs within the third delay period minus second delay period after the trailing edge of a preceding signal ATDP pulse, the pulse output from noise filter 60 is reset and does not terminate until a third delay period delay after the trailing edge of the subsequent pulse in signal ATDP.

In this way, a series of short pulses in signal ATDP is converted into one continuous pulse output from noise filter circuit 60. Furthermore, the continuous pulse output from noise filter circuit 60 will have a minimum duration equal to the third delay period. The minimum duration can be varied by adding logic gates to the delay chain in noise filter 60. Therefore, the first pulse of a series of short pulses will not cause the memory device to read the wrong data.

Figure 5:
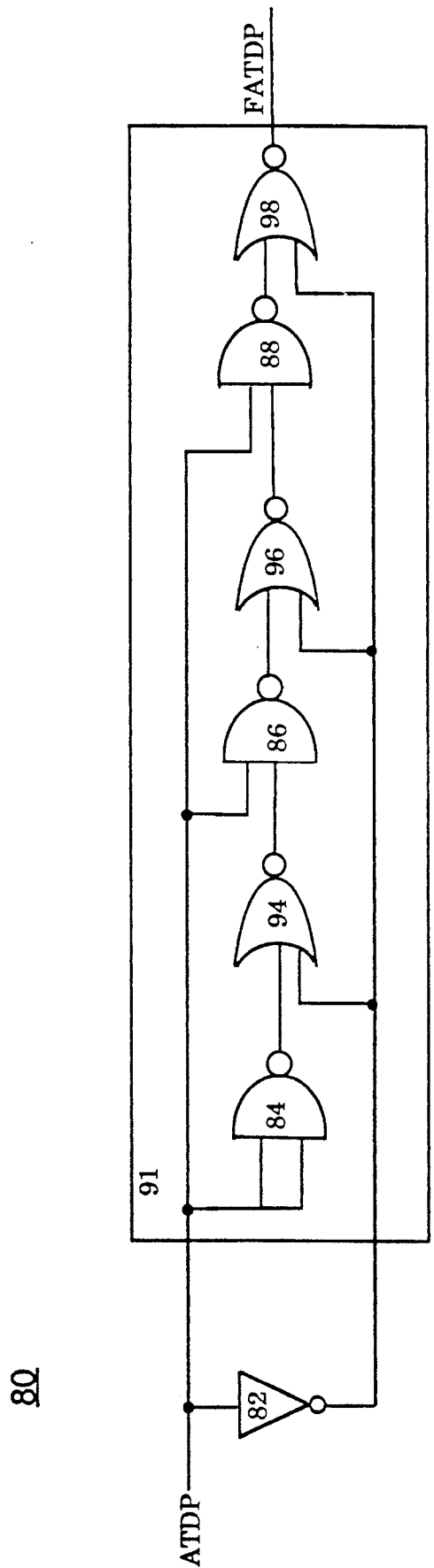
FIG. 5 illustrates six gate delay noise filter circuitry for negative pulses.

FIG. 5 depicts a six gate delay period noise filter circuit 80 for a negative pulse. A negative pulse transitions from one to zero on its leading edge and then transitions from zero to one on its trailing edge. In a case where signal ATDP is comprised of negative pulses, rather than positive pulses, noise filter circuit 80 can be used to filter noise in signal ATDP.

Noise filter circuit 80 is comprised of an inverter 82 and a reset delay circuit 91. The reset delay circuit 91 is comprised of NAND gates 84-88 and NOR gates 94-98.

In noise filter circuit 80, signal ATDP is input into inverter 82, is input into a first input of NAND gates 84-88 and is also input into a second input of NAND gate 84. It will be obvious to one skilled in the art that because both inputs of NAND gate 84 are coupled together, NAND gate 84 could be replaced with an inverter.

The output of inverter 82 is input into a first input of NOR gates 94-98. The outputs of NAND gates 84-88 are input into a second input of NOR gates 94-98, respectively. Together, NAND gates 84-88 and NOR gates 94-98 form a six gate delay chain. Signal FATDP is output from NOR gate 98.

Inverter 82 and NOR gate 98 introduce a two gate delay shift between the leading edge of a signal ATDP pulse input to noise filter circuit 80 and the leading edge of a signal FATDP pulse. The six gate delay chain extends the signal FATDP pulse six gate delay periods beyond the trailing edge of a signal ATDP pulse.

Figure 6:
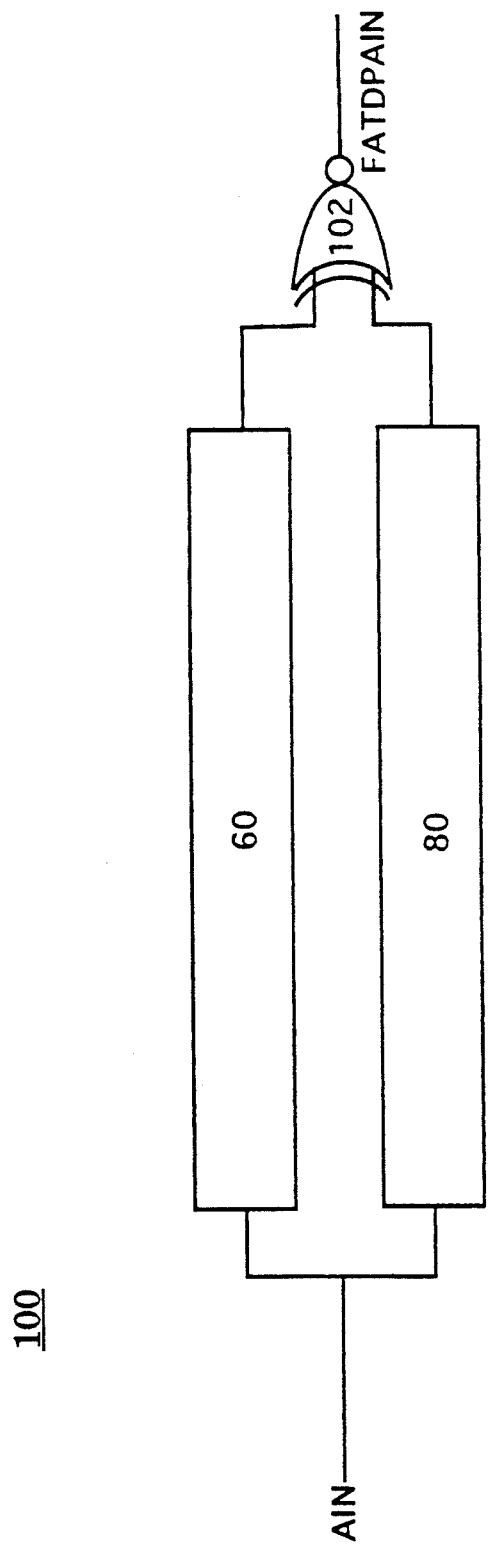
FIG. 6 illustrates address transition pulse generation circuitry with noise filtering.

FIG. 6 depicts a pulse generation circuit 100 which uses the teachings of the present invention to perform noise filtration while generating a pulse whenever the single bit address signal AIN input to pulse generation circuit 100 changes.

Pulse generation circuit 100 is formed by coupling positive and negative impulse noise filter circuits 60 and 80 in parallel. Address signal AIN is input to noise filters 60 and 80. The output signals of noise filters 60 and 80 are input into the first and second inputs of XNOR gate 102. The output of XNOR gate 102 is filtered address transition detection pulse for the single bit input signal AIN ("FATDPAIN").

In pulse generation circuit 100, positive impulse noise filter 60 resets on high going (i.e. zero to one) transitions. On the other hand, negative impulse noise filter 80 resets on low going (i.e. one to zero) transitions.

If a noise pulse is generated on signal AIN, a single FATDPAIN pulse will be generated by either noise filter 60 or 80 depending upon whether the noise pulse is a positive or negative pulse.

Figure 7:
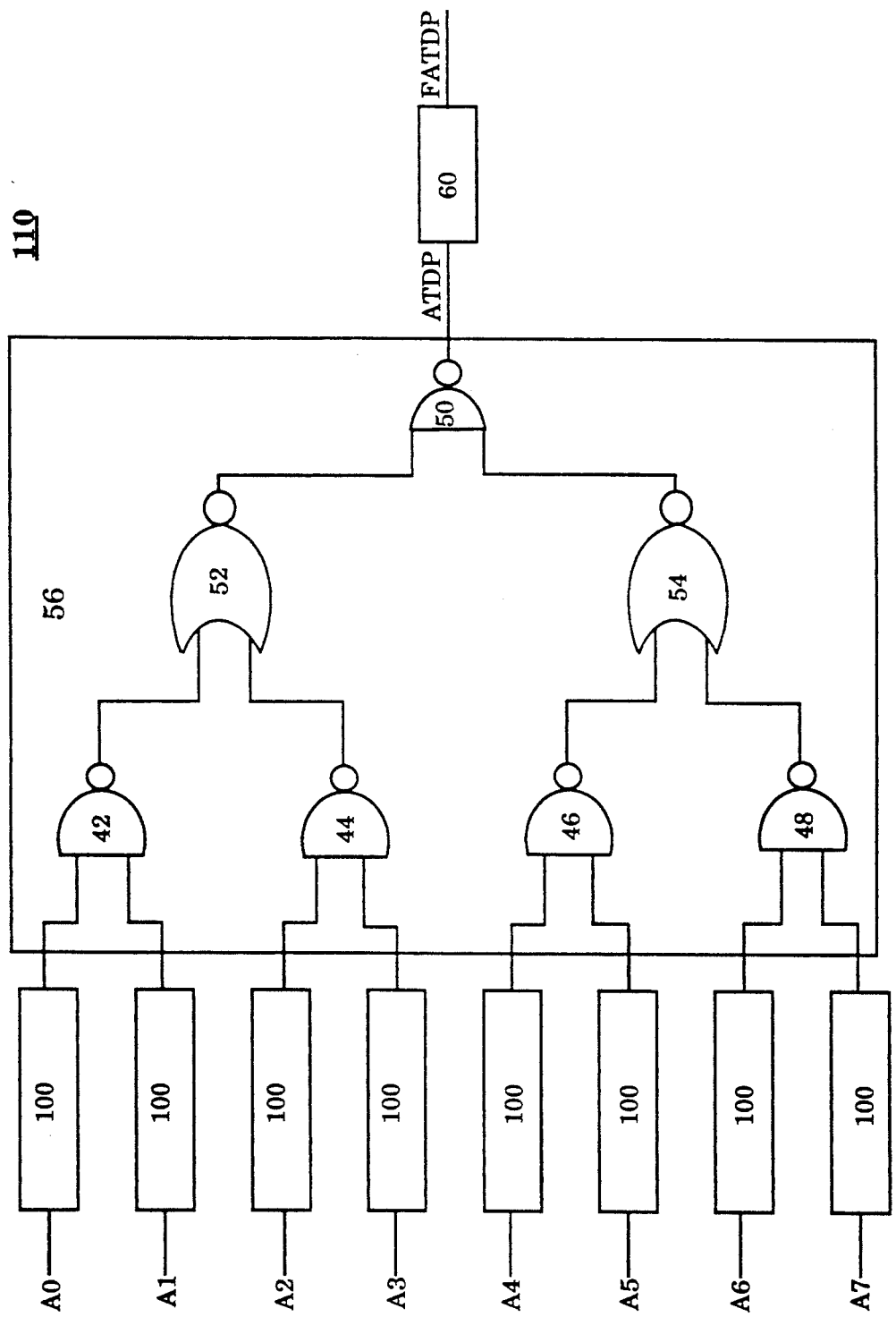
FIG. 7 illustrates eight bit address transition detection circuitry with noise filtering.

FIG. 7 depicts an address transition detection circuit 110 with noise filtering for an eight bit address signal. The eight bit address signal is comprised of address signals A0-A7. Each address signal A0-A7 is input to a separate pulse generation circuit 100. The output of each of the pulse generation circuits 100 is input to a summation circuit 56.

Summation circuit 56 is comprised of five NAND gates 42-50 and two NOR gates 52-54. The output of NAND gates 42-44 provide input to NOR gate 52. Similarly, the output of NAND gates 46-48 provide input to NOR gate 54. The output of NOR gates 52-54, in turn, provide input to NAND gate 50. NAND gate 50 has as output signal ATDP. Summation circuit 56 combines all of the address transition pulses corresponding to each of the address signal lines A0-A7 into signal ATDP. Signal ATDP is then input into final noise filter circuit 60. The output of noise filter 60 is signal FATDP.

In an alternate embodiment of the present invention, for a seven bit address signal (A0-A6), signal A7 would instead be a chip enable signal. Treating the chip enable signal as an additional address signal line causes the address transition detection scheme to work whenever the chip is enabled. In such a case, the change in the chip enable signal will cause a signal ATDP pulse to be generated. Hence, the address signaled on address signal lines A0-A6 will be read as soon as the chip is enabled.

Thus, the present invention implements noise filtering in an address transition detection scheme for a flash memory integrated circuit. As such, the present invention increases the speed at which the flash memory can be read while ensuring that all address transitions are properly detected so that the proper data is read from the flash memory cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A noise filter apparatus for a digital input signal, said digital input signal comprising at least one input signal pulse, said input signal pulse having a leading and a trailing edge, said input signal pulse transitioning from a first voltage level to a second voltage level on said leading edge, said first voltage level not equal to said second voltage level, said noise filter apparatus comprising:

a first inversion circuit for inverting and delaying said digital input signal, said first inversion circuit having as input said digital input signal and having as output a first intermediate signal, said first intermediate signal being an inversion of said digital input signal and lagging said digital input signal by a first delay period, said first intermediate signal transitioning from said second voltage level to said first voltage level said first delay period following each said leading edge of said digital input signal and said first intermediate signal transitioning from said first voltage level to said second voltage level said first delay period following each said trailing edge of said digital input signal;

a delay chain circuit, coupled to said first inversion circuit, said delay chain circuit having as input said digital input signal and said first intermediate signal, said delay chain circuit having as output a filtered output signal, if said filtered output signal is not at said second voltage level, said filtered output signal transitioning to said second voltage level a second delay period following said leading edge, said delay chain circuit introducing a third delay period, said third delay period longer than said second delay period, said third delay period resetting following the trailing edge of each said digital input signal pulse, such that said filtered output signal transitions to said first voltage level said third delay period following said trailing edge unless a subsequent said leading edge occurs within said third delay period minus said second delay period from said trailing edge.

2. The noise filter apparatus as set forth in claim 1 wherein said first inversion circuit comprises an inverter logic gate.

3. The noise filter apparatus as set forth in claim 2 wherein said first inversion circuit comprises an odd number of inverter logic gates coupled in series.

4. The noise filter apparatus as set forth in claim 1 wherein said first voltage level corresponds to a logical zero and said second voltage level corresponds to a logical one, and said delay chain circuit comprises:

a second inversion circuit for inverting and delaying said digital input signal, said second inversion circuit having as input said digital input signal and having as output a second intermediate signal, said second intermediate signal being an inversion of said digital input signal and lagging said digital input signal by said first delay period, said second intermediate signal transitioning from said second voltage level to said first voltage level said first delay period following each said leading edge of said digital input signal and said second intermediate signal transitioning from said first voltage level to said second voltage level said first delay period following each said trailing edge of said digital input signal;

a first NAND logic gate, coupled to said first and said second inversion circuits, said first NAND logic gate having as input said first and second intermediate signals and having as output a first NAND output signal, said first NAND output signal being formed by performing a logical NAND operation on said first and second intermediate signals;

a first NOR logic gate, coupled to said first NAND logic gate, said first NOR logic gate having as input said digital input signal and said first NAND output signal and having as output a first NOR output signal, said first NOR output signal being formed by performing a logical NOR operation on said digital input signal and said first NAND output signal; and a second NAND logic gate, coupled to said first inversion circuit and said first NOR logic gate, said second NAND logic gate having as input said first intermediate signal and said first NOR output signal and having as output said filtered output signal, said filtered output signal being formed by performing a logical NAND operation on said first intermediate signal and said first NOR output signal.

5. The noise filter apparatus as set forth in claim 1 wherein said first voltage level corresponds to a logical one and said second voltage level corresponds to a logical zero, and said delay chain circuit comprises:

a second inversion circuit for inverting and delaying said first intermediate signal, said second inversion circuit having as input said digital input signal and having as output a second intermediate signal, said second intermediate signal being an inversion of said first intermediate signal and lagging said digital input signal by said first delay period, said second intermediate signal transitioning from said second voltage level to said first voltage level said first delay period following each said leading edge of said digital input signal and said second intermediate signal transitioning from said first voltage level to said second voltage level said first delay period following each said trailing edge of said digital input signal;

a first NOR logic gate, coupled to said first and said second inversion circuits, said first NOR logic gate having as input said first and second intermediate signals and having as output a first NOR output signal, said first NOR output signal being formed by performing a logical NOR operation on said first and second intermediate signals;

a first NAND logic gate, coupled to said first NOR logic gate, said first NAND logic gate having as input said digital input signal and said first NOR output signal and having as output a first NAND output signal, said first NAND output signal being formed by performing a logical NAND operation on said digital input signal and said first NOR output signal; and a second NOR logic gate, coupled to said first inversion circuit and said first NAND logic gate, said second NOR logic gate having as input said first intermediate signal and said first NAND output signal and having as output said filtered output signal, said filtered output signal being formed by performing a logical NOR operation on said first intermediate signal and said first NAND output signal.

6. The noise filter apparatus as set forth in claim 1 wherein
said digital input signal is an address transition detection signal;
said first voltage level of said digital input signal corresponds to a first state when no address transition is detected; and
said second voltage level of said digital input signal corresponds to a second state when an address transition has been detected.

7. A transition detection circuit for a digital input signal, said digital input signal having a first state corresponding to a first voltage level and a second state corresponding to a second voltage level, said first voltage level not equal to said second voltage level, said transition detection circuit detecting a positive transition from said first state to said second state and a negative transition from said second state to said first state, said transition detection circuit comprising:

a positive pulse noise filter circuit, having as input said digital input signal and having as output a first filtered output signal;

a negative pulse noise filter circuit, having as input said digital input signal and having as output a second filtered output signal; and an equivalence logic circuit, coupled to said positive and said negative pulse noise filter circuits, said equivalence logic circuit having as input said first and second filtered output signals and having as output a transition detection signal, said transition detection signal lagging said first and second filtered output signals by a fourth delay period, said transition detection signal having a third voltage level said fourth delay period following a time when said first and second filtered output signals have a same value, said transition detection signal having a fourth voltage level said fourth delay period following a time when said first and second filtered output signals have a different value, said third voltage level being a first selected one of said first and second voltage levels, said fourth voltage level being a second selected one of said first and second voltage levels, said third voltage level not equal to said fourth voltage level;

said positive pulse noise filter comprising:
a first inversion circuit for inverting and delaying said digital input signal, said first inversion circuit having as input said digital input signal and having as output a first intermediate signal, said first intermediate signal being an inversion of said digital input signal and lagging said digital input signal by a first delay period, said first intermediate signal transitioning from said second voltage level to said first voltage level said first delay period following each said positive transition of said digital input signal and said first intermediate signal transitioning from said first voltage level to said second voltage level said first delay period following each said negative transition of said digital input signal;

a delay chain circuit, coupled to said first inversion circuit, said delay chain circuit having as input said digital input signal and said first intermediate signal, said delay chain circuit having as output said first filtered output signal, if said first filtered output signal is not at said second voltage level, said filtered output signal transitioning to said second voltage level a second delay period following said positive transition, said first delay chain circuit introducing a third delay period, said third delay period longer than said second delay period, said third delay period resetting following each said negative transition, such that said first filtered output signal transitions to said first voltage level said third delay period following said each said negative transition unless a subsequent said positive transition occurs within said third delay period minus said second delay period from said negative transition.

8. The transition detection circuit as set forth in claim 7 wherein said first inversion circuit comprises an inverter logic gate.

9. The transition detection circuit as set forth in claim 7 wherein said first inversion circuit comprises an odd number of inverter logic gates coupled in series.

10. The transition detection circuit as set forth in claim 7 wherein said first voltage level corresponds to a logical zero and said second voltage level corresponds to a logical one, and said delay chain circuit comprises:

a second inversion circuit for inverting and delaying said digital input signal, said second inversion circuit having as input said digital input signal and having as output a second intermediate signal, said second intermediate signal being an inversion of said digital input signal and lagging said digital input signal by said first delay period, said second intermediate signal transitioning from said second voltage level to said first voltage level said first delay period following each said positive transition of said digital input signal and said second intermediate signal transitioning from said first voltage level to said second voltage level said first delay period following each said negative transition of said digital input signal;

a first NAND logic gate, coupled to said first and said second inversion circuits, said first NAND logic gate having as input said first and second intermediate signals and having as output a first NAND output signal, said first NAND output signal being formed by performing a logical NAND operation on said first and second intermediate signals;

a NOR logic gate, coupled to said first NAND logic gate, said NOR logic gate having as input said digital input signal and said first NAND output signal and having as output a NOR output signal, said NOR output signal being formed by performing a logical NOR operation on said digital input signal and said first NAND output signal; and a second NAND logic gate, coupled to said first inversion circuit and said NOR logic gate, said second NAND logic gate having as input said first intermediate signal and said NOR output signal and having as output said first filtered output signal, said first filtered output signal being formed by performing a logical NAND operation on said first intermediate signal and said NOR output signal.

11. A transition detection circuit for a digital input signal, said digital input signal having a first state corresponding to a first voltage level and a second state corresponding to a second voltage level, said first voltage level not equal to said second voltage level, said transition detection circuit detecting a positive transition from said first state to said second state and a negative transition from said second state to said first state, said transition detection circuit comprising:

a positive pulse noise filter circuit, having as input said digital input signal and having as output a first filtered output signal;

a negative pulse noise filter circuit, having as input said digital input signal and having as output a second filtered output signal; and an equivalence logic circuit, coupled to said positive and said negative pulse noise filter circuits, said equivalence logic circuit having as input said first and second filtered output signals and having as output a transition detection signal, said transition detection signal lagging said first and second filtered output signals by a fourth delay period, said transition detection signal having a third voltage level said fourth delay period following a time when said first and second filtered output signals have a same value, said transition detection signal having a fourth voltage level said fourth delay period following a time when said first and second filtered output signals have a different value, said third voltage level being a first selected one of said first and second voltage levels, said fourth voltage level being a second selected one of said first and second voltage levels, said third voltage level not equal to said fourth voltage level;

said negative pulse noise filter comprising:

a first inversion circuit for inverting and delaying said digital input signal, said first inversion circuit having as input said digital input signal and having as output a first intermediate signal, said first intermediate signal being an inversion of said digital input signal and lagging said digital input signal by a first delay period, said first intermediate signal transitioning from said second voltage level to said first voltage level said first delay period following each said positive transition of said digital input signal and said first intermediate signal transitioning from said first voltage level to said second voltage level said first delay period following each said negative transition of said digital input signal;

a delay chain circuit, coupled to said first inversion circuit, said delay chain circuit having as input said digital input signal and said first intermediate signal, said delay chain circuit having as output said second filtered output signal, if said second filtered output signal is not at said first voltage level, said second filtered output signal transitioning to said first voltage level a second delay period following said negative transition, said delay chain circuit introducing a third delay period, said third delay period longer than said second delay period, said third delay period resetting following each said positive transition, such that said second filtered output signal transitions to said second voltage level said third delay period following said each said positive transition unless a subsequent said negative transition occurs within said third delay period minus said second delay period from said positive transition.

12. The transition detection circuit as set forth in claim 11 wherein said first inversion circuit comprises an inverter logic gate.

13. The transition detection circuit as set forth in claim 11 wherein said first inversion circuit comprises an odd number of inverter logic gates coupled in series.

14. The transition detection circuit as set forth in claim 11 wherein said first voltage level corresponds to a logical zero and said second voltage level corresponds to a logical one, and said delay chain circuit comprises:

a second inversion circuit for inverting and delaying said digital input signal, said second inversion circuit having as input said digital input signal and having as output a second intermediate signal, said second intermediate signal being an inversion of said digital input signal and lagging said digital input signal by said first delay period, said second intermediate signal transitioning from said second voltage level to said first voltage level said first delay period following each said positive transition of said digital input signal and said second intermediate signal transitioning from said first voltage level to said second voltage level said first delay period following each said negative transition of said digital input signal;

a first NOR logic gate, coupled to said first and second inversion circuits, said first NOR logic gate having as input said first and second intermediate signals and having as output a first NOR output signal, said first NOR output signal being formed by performing a logical NOR operation on said first and second intermediate signals;

a NAND logic gate, coupled to said first NOR logic gate, said NAND logic gate having as input said digital input signal and said first NOR output signal and having as output a NAND output signal, said NAND output signal being formed by performing a logical NAND operation on said digital input signal and said first NOR output signal; and a second NOR logic gate, coupled to said first inversion circuit and said NAND logic gate, said second NOR logic gate having as input said first intermediate signal and said NAND output signal and having as output said second filtered output signal, said second filtered output signal being formed by performing a logical NOR operation on said first intermediate signal and said NAND output signal.

15. The transition detection circuit as set forth in claim 11 wherein said digital input signal is an address signal.

16. A method for filtering noise of a digital input signal, said digital input signal comprising at least one input signal pulse, said input signal pulse having a leading and a trailing edge, said input signal pulse transitioning from a first voltage level to a second voltage level on said leading edge and then transitioning from said second voltage level to said first voltage level on said trailing edge, said first voltage level not equal to said second voltage level, said noise filtering method comprising the steps of:

forming a first intermediate signal by inverting and delaying said digital input signal a first delay period, said first intermediate signal being an inversion of said digital input signal and lagging said digital input signal by a first delay period such that said first intermediate signal transitioning from said second voltage level to said first voltage level said first delay period following each said leading edge of said digital input signal, and said first intermediate signal transitioning from said first voltage level to said second voltage level said first delay period following each said trailing edge of said digital input signal;

generating a filtered output signal, if said filtered output signal is not at said second voltage level, said filtered output signal transitioning to said second voltage level a second delay period following said leading edge, said filtered output signal transitioning to said first voltage level a third delay period following said trailing edge unless a subsequent said leading edge occurs within said third delay period minus said second delay period from said trailing edge, said third delay period longer than said second delay period.

17. The method of noise filtering as set forth in claim 16 wherein said digital input signal is an address transition detection signal;

said first voltage level of said digital input signal corresponds to a first state when no address transition is detected; and said second voltage level of said digital input signal corresponds to a second state when an address transition has been detected.

18. The transition detection circuit as set forth in claim 7 wherein said digital input signal is an address signal.

* * * * *